United States Patent

[11] 3,560,814

[72] Inventors Reiner Engbert
Talheim;
Reinhold Kaiser, Heilbronn, Germany

[21] Appl. No. 719,641
[22] Filed Apr. 8, 1968
[45] Patented Feb. 2, 1971
[73] Assignee Telefunken Patentverwertungsgesellschaft m.b.H.g.
Ulm Danube, Germany
[32] Priority Apr. 8, 1967
[33] Germany
[31] T33623

[54] TRANSISTOR WITH STRIP SHAPED EMITTER
5 Claims, 5 Drawing Figs.

[52] U.S. Cl. .......... 317/235, 317/234: 29/589; 148/186
[51] Int. Cl. .......... H01l 11/00, H01l 19/00
[50] Field of Search .......... 317/235, 44, 40.13, 40.1, 22

[56] References Cited

UNITED STATES PATENTS

| | | | |
|---|---|---|---|
| 3,166,448 | 1/1965 | Hubner | 148/177 |
| 3,337,783 | 8/1967 | Stehney | 317/235 |
| 3,325,706 | 6/1967 | Kruper | 317/235 |
| 3,277,352 | 10/1966 | Hubner | 317/234 |

*Primary Examiner*—John W. Huckert
*Assistant Examiner*—B. Estrin
*Attorney*—Spencer and Kaye

ABSTRACT: A semiconductor arrangement of the type having a collector zone of a first conductivity type, a base zone of a second conductivity type and an emitter zone of the first conductivity type. Part of the base zone is arranged to extend through an opening in the emitter zone and is short-circuited to the emitter zone.

Inventors.
Reiner Engbert
Reinhold Kalser
BY Spencer & Kaye
ATTORNEYS.

Inventors.
Reiner Engbert
Reinhold Kaiser

BY Spencer & Kaye
ATTORNEYS.

TRANSISTOR WITH STRIP SHAPED EMITTER

BACKGROUND OF THE INVENTION

The present invention relates to a semiconductor arrangement which has the properties of a tertrode.

It is well known that transistors can be given the properties of a tetrode if the emitter zone is short-circuited with a portion of the base zone by a metal overlay and if this short-circuit electrode is connected to the emitter potential. These transistors with tetrode characteristics can be constructed, for example, as planar transistors or mesa transistors or even manufactured, at least in part, by the alloy techniques common in the art.

SUMMARY OF THE INVENTION

An object of the present invention is to design a semiconductor arrangement which has the properties of a tetrode, yet which allows the emitter zone to be manufactured in an elongated shape so that a plurality of emitters may be arranged next to each other in strips.

A further object of the present invention is to design a semiconductor arrangement which has the properties of a tetrode yet which also has a plurality of emitters which allow the individual emitters to be joined together by conductive paths formed in accordance with the contacting methods now in common use in the art.

These, as well as other objects which will become apparent in the discussion that follows, are achieved, according to the present invention, in a semiconductor having an emitter zone, base zone and collector zone, by providing that part of the base zone extends into an opening through the emitter zone and that the base zone part be short-circuited to the emitter zone.

According to a preferred embodiment of the present invention, the short circuit between base zone and emitter zone, which is required to give the semiconductor arrangement the properties of a tetrode, is effected by applying a metal overlay to the semiconductor surface. This metal overlay is arranged to contact and short circuit the emitter zone and the base zone part extending through the opening in the emitter zone.

The emitter zone can be constructed in the shape of a ring or a frame. In the latter case it may be preferable to construct the emitter zone in the shape of a rectangular frame. If the emitter zone is made with an elongated shape, in accordance with the modern "strip" technique, it is, for example, possible to arrange a plurality of emitter zones side by side in strips.

The resistance of the base zone is so chosen that a base crosscurrent as well as the emitter current will flow. Only the emitter edge will, therefore, emit, as is the case with tetrodes.

DESCRIPTION OF THE PREFERRED EMBODIMENTS

Figure 1:
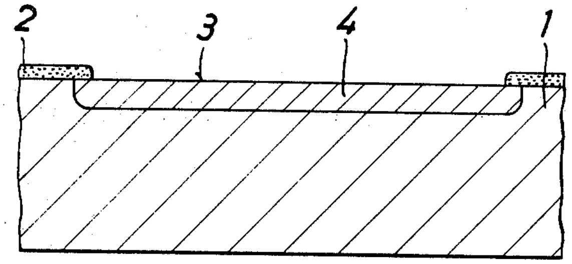
FIG. 1 is a cross-sectional view of a semiconductor arrangement, according to the present, in its first stage of manufacture.

Referring now to the drawings, FIGS. 1 through 5 illustrate the various stages of manufacture of a planar transistor according to the present invention. FIG. 1 shows the first stage of manufacture of such a semiconductor arrangement wherein a diffusion-impeding layer 2 which, for example, may consist of silicon dioxide or of silicon nitride is applied to one surface of a semiconductor body 1 having the conductivity type of the collector zone. A base diffusion window 3 is subsequently etched, according to the usual planar methods, into the isolating layer 2. The base zone 4 is then diffused through the window into a limited region of the semiconductor body 1.

Figures 2, 3:
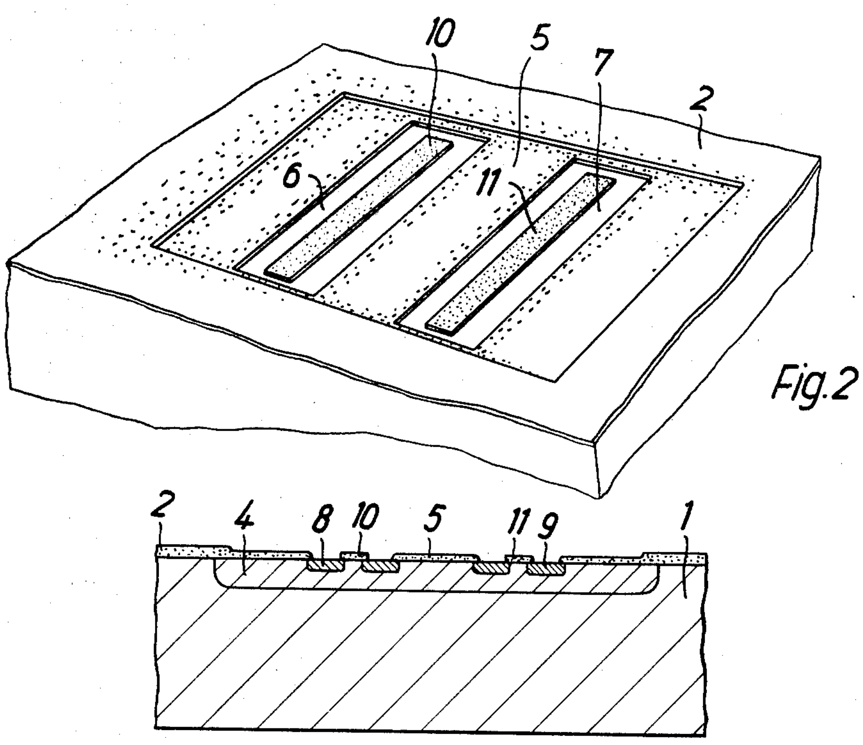
FIG. 2 is a perspective view of the semiconductor arrangement of FIG. 1 in its second stage of manufacture.
FIG. 3 is a cross-sectional view of the semiconductor arrangement of FIG. 1 in its third stage of manufacture.

After the base has been diffusion window 3 is again covered with a diffusion-impeding layer 5. Two elongated frame-shaped emitter diffusion windows 6 and 7 are then etched into the layer 5, as shown in FIG. 2, in preparation for the diffusion of two emitter zones. If impurity material of the type which produces emitter zones in the semiconductor body is then diffused through these two diffusion windows, a transistor is created, as shown in cross section in FIG. 3, having two frame-shaped emitter zones 8 and 9 which surround openings that are penetrated by parts of the base zone 4.

Figure 4:
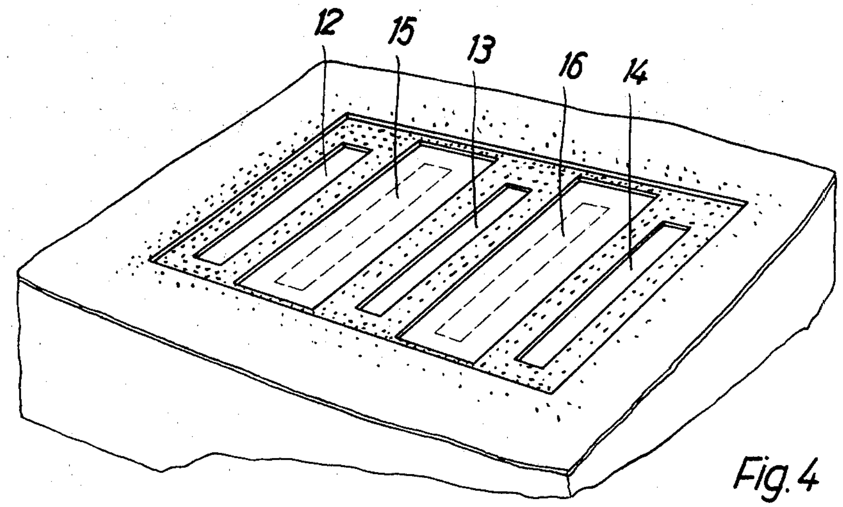
FIG. 4 is a perspective view of the semiconductor arrangement of FIG. 1 in its fourth stage of manufacture.

The parts of the diffusion-impeding layer 5, designated with the numbers 10 and 11, which formed the centers of the two emitter diffusion windows 6 and 7, as well as three elongated surface regions of the layer 5 are next removed to expose the base zone 4 as shown in FIG. 4. The removal of the portions 10 and 11 of the diffusion-impeding layer 5 exposes sections 15 and 16, respectively, of the base zone 4. These sections extend up to the semiconductor surface through the openings in the emitter zone 8 and 9, respectively.

Figure 5:
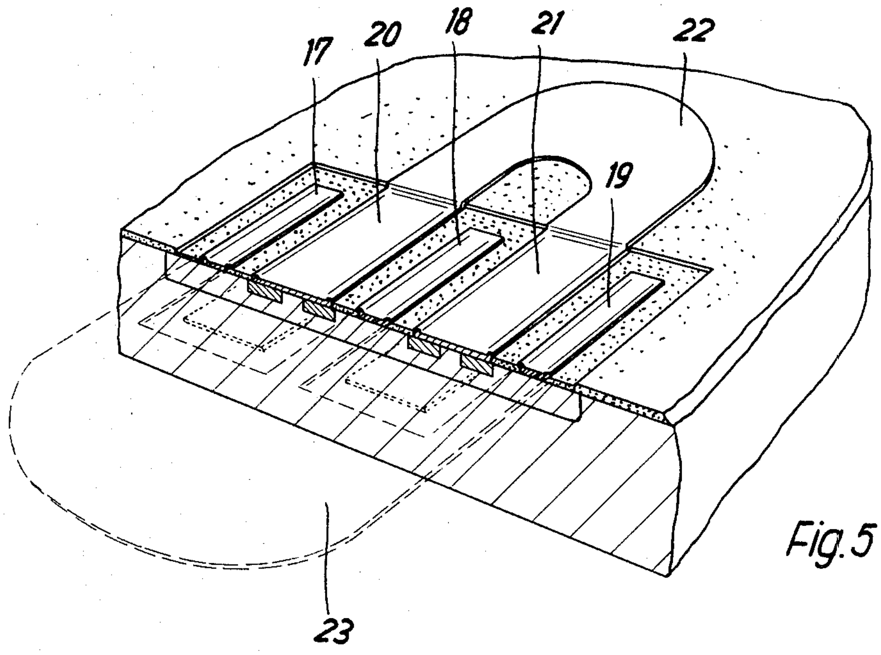
FIG. 5 is a perspective view, partly in cross section, of the semiconductor arrangement of FIG. 1 in its final stage of manufacture.

FIG. 5 shows how the various zones of the transistor are contacted. The base zone is contacted with three base electrodes 17, 18 and 19 by vaporizing electrode material onto the openings 12, 13 and 14 of FIG. 4, respectively.

The tetrode properties of the transistor are obtained by vaporizing electrode material on both the surfaces of the emitter zones as well as the surfaces of the sections 15 and 16 of the base zone which extend into the openings in the emitter zones up to the semiconductor surface. This vaporization process produces the electrodes 20 and 21 which short circuit the emitter zones 8 and 9 with the sections 15 and 16 of the base zone that extend into their respective openings. A common terminal 22 is provided to supply both the electrodes 20 and 21 with the emitter potential; the common terminal 23 is provided to supply the base electrodes 17, 18 and 19 with base potential. Thus, both the emitter as well as the base electrodes are always connected together in parallel by the common terminals 22 and 23, respectively. In general, the collector body is contacted on the side opposite to the side with the base end emitter electrodes.

As already mentioned transistors can be given the properties of a tetrode by short-circuiting the emitter zone with a portion of the base zone. In this case the short-circuited portion of the base zone has another potential than this portion of the base zone which receives the base potential by the base electrode. The potential difference between these two portions of the base zone causes a crosscurrent in the base zone and because of the base resistance an voltage drop by which not the whole emitter zones 8 and 9 but only the edge of those emitter zones will emit emission current.

The voltage drop in the base zone and by this the emission of the emitter zones depends on the resistance of the base zone which has, for example, a value of 100 Ohm. to several Kiloohm in the vicinity of the emitter zone.

The transistor in the preferred embodiment illustrated in FIG. 5 has two emitter zones and three base electrodes. It is similarly possible to construct the transistor in accordance with the present invention so that it will assume many other embodiments. It is possible, for example, to construct the transistor with only one emitter zone and with only one or two base electrodes. It is further possible to construct the transistor with more than two emitters and with correspondingly many base electrodes. The emitter zones of the preferred embodiment of the transistor shown in FIG. 5 have been constructed in the shape of rectangular frames. It is possible, too, to construct these emitter zones in other shapes, such as ovals or rings.

It will be understood that the above description of the present invention is susceptible to various modifications, changes and adaptations, and the same are intended to be comprehended within the meaning and range of equivalents of the appended claims

We claim

1. In a transistor having a semiconductor body containing a collector zone of a first conductivity type, a base zone of a second conductivity type, and an emitter zone of said first conductivity type formed within said base zone adjacent a single surface of said body, said base zone surrounding said emitter zone at said surface the improvement wherein said emitter zone has an elongated shape; wherein a portion of said base zone extends to said surface via an opening through said emitter zone and is completely surrounded by said emitter zone at said surface, said portion of said base zone being short-circuited to said emitter zone at said surface; and wherein separate contact means are provided at said surface for contacting a portion of said base zone surrounding said emitter zone.

2. The improvement defined in claim 1 wherein said elongated emitter zone has the shape of a rectangular strip, and said opening within the emitter zone is also of rectangular strip, and said opening within the emitter zone is also of rectangular strip shape.

3. The improvement defined in claim 2 wherein there are a plurality of said rectangular shaped emitter zones, each with a rectangular shaped opening containing a portion of the base zone therein, said emitter zones being arranged parallel to each other on said surface.

4. The improvement defined in claim 1 wherein said surrounded portion of said base zone and said emitter zone are short-circuited by a metallic layer covering the outer surface of said portion of said base zone and said emitter zone.

5. In a transistor having a semiconductor body containing a collector zone of a first conductivity type, a base zone of a second conductivity type extending to a surface thereof, and an emitter zone of said first conductivity type formed within said base zone adjacent said surface, said base zone surrounding said emitter zone at said surface; the improvement wherein said emitter zone includes a plurality of frame shaped portions arranged side by side in strips; wherein portions of said base zone extend to said surface through openings within said portions of said emitter zone; wherein said portions of said base zone are short-circuited to said emitter zone by a metal overlay arranged on said surface over said emitter zone and said portions of said base zone, said metal overlay forming the emitter contact for said transistor, and wherein a separate contact means is provided on said surface for said base zone, a portion of said contact means being positioned on said base zone intermediate said frame shaped emitter portions, said metal overlay and said contact means being interdigitated.